United States Patent
Pribytko et al.

(10) Patent No.: US 7,030,697 B1
(45) Date of Patent: Apr. 18, 2006

(54) METHOD AND APPARATUS FOR PROVIDING HIGH COMMON-MODE REJECTION RATIO IN A SINGLE-ENDED CMOS OPERATIONAL TRANSCONDUCTANCE AMPLIFIER

(75) Inventors: Maxim Pribytko, Inchicore Terrace North (IE); Patrick J. Quinn, Clondalkin (IE)

(73) Assignee: Xilinx, Inc., San Jose, CA (US)

( * ) Notice: Subject to any disclaimer, the term of this patent is extended or adjusted under 35 U.S.C. 154(b) by 63 days.

(21) Appl. No.: 10/717,344

(22) Filed: Nov. 18, 2003

(51) Int. Cl.
  *H03F 3/45* (2006.01)
(52) U.S. Cl. ...................................... 330/257; 330/258
(58) Field of Classification Search .............. 330/257, 330/258
See application file for complete search history.

(56) References Cited

U.S. PATENT DOCUMENTS

| | | | | |
|---|---|---|---|---|
| 5,006,817 A | * | 4/1991 | Babanezhad | 330/258 |
| 6,556,081 B1 | * | 4/2003 | Muza | 330/258 |
| 6,600,483 B1 | * | 7/2003 | Akita et al. | 345/204 |

OTHER PUBLICATIONS

Maxim Pribytko, Patrick Quinn; "A CMOS single-Ended OTA with High CMRR"; European Solid-State Circuits Conference; ESSCIRC 2003; Sep. 17th; 4 pages.

* cited by examiner

*Primary Examiner*—Khanh V. Nguyen
(74) *Attorney, Agent, or Firm*—LeRoy D. Maunu; Kim Kanzaki

(57) ABSTRACT

A method and apparatus for providing high common-mode rejection ratio (CMRR) in a single-ended CMOS operational transconductance amplifier is disclosed. A common-mode feedback boosts the OTA CMRR, while allowing integration of conventional OTA improvements.

22 Claims, 6 Drawing Sheets

METHOD AND APPARATUS FOR PROVIDING HIGH COMMON-MODE REJECTION RATIO IN A SINGLE-ENDED CMOS OPERATIONAL TRANSCONDUCTANCE AMPLIFIER

FIELD OF THE INVENTION

This invention relates in general to Complementary Metal-Oxide Semiconductor (CMOS) amplifiers, and more particularly to a method and apparatus for providing high common-mode rejection ratio in a single-ended CMOS operational transconductance amplifier.

BACKGROUND

Over the last few decades, analog integrated circuits have more and more been replaced by digital circuits because digital circuits tend to be less noisy, require a lesser area per complexity. However, the outside world is of analog nature and to be able to interact with computers, etc., some amount of analog circuits, e.g., filters and amplifiers, and mixed analog/digital circuits, e.g., digital-to-analog and analog-to-digital converters, are needed. Moreover, for very high frequencies the design of digital circuits becomes more of an analog nature, since the transistor no longer can be considered as a switch.

The circuit industry has witnessed increasing levels of integration for such applications and CMOS has emerged as the technology most suited to cost-effective, high-volume integration. The CMOS transistor and other important common analog building blocks are used in all high-speed high-resolution circuits. These building blocks are used to design larger more complex circuits, e.g., continuous-time filters, discrete-time filters, power amplifiers, and data converters.

An operational transconductance amplifier (OTA) or its buffered version is a fundamental building block for many switched capacitor and continuous time filters and data converters. Depending on the application, there are different requirements imposed on the OTA. In continuous time filters, for example, where the OTA often operates in an open loop configuration, the linearity and phase response are important. Sampled data circuits usually require a high open loop gain and stability in a closed loop configuration. The demand for fast OTA settling and slewing resulted in sophisticated class AB amplifiers and elegant biasing techniques. OTA dynamic range is becoming an important parameter when migrating to reduced supply voltages. Numerous OTA optimization and compensation techniques exist. However, the OTA that meets the requirements of all applications does not exist. Rather, the OTA remains a handcrafted circuit in most cases.

Differential OTAs have better inherent cancellation of first order CMRR due to their pure differential nature. However, some circuits cannot be implemented using differential OTAs. Implementing a differential circuit using single-ended OTAs places a high demand on CMRR of single-ended OTAs. For example, an ADC may be implemented using single ended large input/output dynamic range OTAs with a high common-mode rejection ratio (CMRR) and open loop gain. Single-stage OTAs are power efficient for high-speed applications. Three basic configurations of the single-stage OTAs are available, namely the telescopic, current mirror and folded cascode topologies. Contrary to the fully differential OTA, the single ended current mirror OTA does not have first order cancellation of CMRR. Thus, while a high open loop gain, e.g., 66 dB, can be achieved using standard techniques, target high CMRR is a design challenge.

It can be seen then that there is a need for a method and apparatus for providing high CMRR in a single-ended CMOS operational transconductance amplifier.

SUMMARY OF THE INVENTION

Various embodiments of the present invention provide high common-mode rejection ratio (CMRR) in a single-ended CMOS operational transconductance amplifier.

The present invention solves the above-described problems by providing common-mode feedback that boosts the OTA CMRR, while allowing integration of conventional OTA improvements. The OTA input/output common mode range, die area, power and slewing speed are not affected, but the settling speed is reduced.

A system in accordance with the principles of the present invention includes a differential input transistor pair providing an input stage for receiving a pair of input voltages, a current source, coupled to the differential input pair, for providing current to the differential input pair, an output transistor for conducting an output current proportional to a difference between the pair of input voltages applied to the differential input transistor and a common-mode feedback section, coupled to the differential input transistor pair, wherein the common-mode feedback section absorbs a current change in the current source to maintain a constant current in the output transistor.

In another embodiment of the present invention, a method for providing high common-mode rejection ratio in a single-ended CMOS operational transconductance amplifier is provided. The method includes providing an differential input stage and compensating for a current change caused by a common-mode level change at the input stage to maintain a constant current at an output.

In another embodiment of the present invention, an analog-to-digital converter (ADC) is provided. The analog-to-digital converter includes a sample-and-hold circuit for sampling an input analog signal and providing a held sample at an output of the sample-and-hold circuit, a gain stage, coupled to the output of the sample-and-hold circuit, for amplifying the held sample and providing an amplified signal at an output of the gain stage and a comparator circuit, coupled to the output of the gain stage, the comparator circuit comparing the amplified signal to a reference signal to provide a digital output based upon the comparison, wherein at least one of the sample-and-hold circuit, gain stage and comparator circuit includes a CMOS operational transconductance amplifier, the CMOS operational transconductance amplifier comprises a differential input transistor pair providing an input stage for receiving a pair of input voltages, a current source, coupled to the differential input pair, for providing current to the differential input pair, an output transistor for conducting an output current proportional to a difference between the pair of input voltages applied to the differential input transistor and a common-mode feedback section, coupled to the differential input transistor pair, wherein the common-mode feedback section absorbs a current change in the current source to maintain a constant current in the output transistor.

In another embodiment of the present invention, another CMOS operational transconductance amplifier is provided. This CMOS operational transconductance amplifier includes means for providing an input stage for receiving a pair of input voltages, means, coupled to the differential input pair, for providing current to the differential input pair, means for conducting an output current proportional to a difference between the pair of input voltages applied to the means for providing the input stage and means, coupled to the means for providing an input stage, for absorbing a current change in the means for providing current to maintain a constant current in the means for conducting.

In another embodiment of the present invention, another CMOS operational transconductance amplifier is provided. This embodiment of the CMOS operational transconductance amplifier includes a differential transistor pair providing an input stage, a current source, coupled to the differential input pair, for providing current to the differential input pair, an output transistor providing an output current, a first current mirror transistor coupled to a drain of a first transistor of the differential input pair, a second current mirror transistor coupled to a drain of a second transistor of the differential input pair, the second current mirror transistor being coupled to the output transistor for providing a mirrored current as the output current for the output transistor, a second current source and a common-mode feedback differential pair, coupled to the second current source and to the first and second current mirror transistors, a transistor of the common-mode feedback differential pair mirroring current through the first current mirror transistor to compensate for a current change in the current source to maintain a constant mirrored current.

It will be appreciated that various other embodiments are set forth in the Detailed Description and claims which follow.

BRIEF DESCRIPTION OF THE DRAWINGS

Referring now to the drawings in which like reference numbers represent corresponding parts throughout.

DETAILED DESCRIPTION

In the following description of the embodiments, reference is made to the accompanying drawings that form a part hereof, and in which is shown by way of illustration the specific embodiments in which the invention may be practiced. It is to be understood that other embodiments may be utilized because structural changes may be made without departing from the scope of the present invention.

The present invention provides a method and apparatus for providing high common-mode rejection ratio in a single-ended CMOS operational transconductance amplifier (OTA). Common-mode feedback is used to boost the OTA CMRR, while allowing integration of conventional OTA improvements. The OTA input/output common mode range, die area, power and slewing speed are not affected, but the settling speed is reduced.

Figure 1:
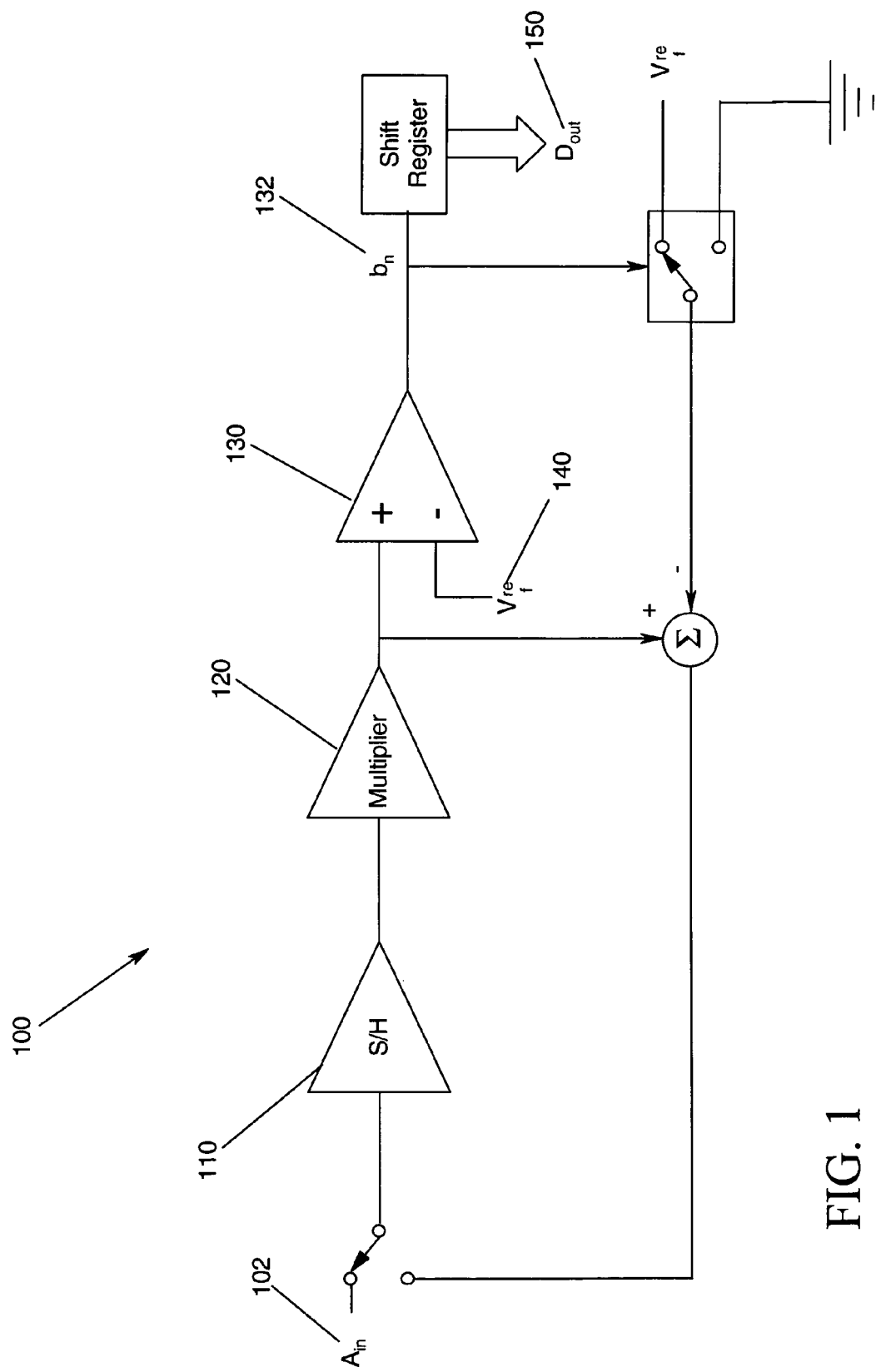
FIG. 1 illustrates a simplified block diagram of one embodiment of an algorithmic analog-to-digital converter.

FIG. 1 illustrates a simplified block diagram 100 of one embodiment of an algorithmic analog-to-digital converter. Those skilled in the art will recognize that there are several types of algorithmic analog-to-digital converters, and that the algorithmic analog-to-digital converter illustrated in FIG. 1 is merely one example. The algorithmic analog-to-digital converter 100 of FIG. 1 includes a sample-and-hold circuit (S/H) 110 adapted for sampling and holding a signal, an amplifier 120 adapted for amplifying an output voltage signal from said sample-and-hold circuit 110, and a comparator 130 adapted for comparing an output voltage signal from the operational amplifier 120 with a reference voltage.

To convert an analog input signal $A_{in}$ 102 to a multi-bit digital output value $D_{out}$ 150, the converter 100 is operated for N conversion cycles, where N is the number of bits in the digital output value $D_{out}$ 150. The comparator 130 generates a binary signal $b_n$ 132 indicating whether or not the output of the amplifier is greater than a reference voltage $V_{ref}$ 140 for the nth conversion cycle.

Those skilled in the art will recognize that the present invention is not meant to be limited to use in an analog-to-digital converter. Rather the presentation of the algorithmic analog-to-digital converter 100 of FIG. 1 is provided merely as one implementation that may utilize a method and apparatus for providing high common-mode rejection ratio in a single-ended CMOS operational transconductance amplifier according to embodiments of the present invention. Nevertheless, as mentioned above, for high bit resolution circuits the DC gain should be very high to provide a high accuracy conversion. However, differential OTAs do not provide the characteristics needed in such circuits. Therefore, to provide a high-resolution circuit having high gain, a single ended large in-put/output dynamic range OTA with a high common-mode rejection ratio (CMRR) and open loop gain is needed.

Figure 2:
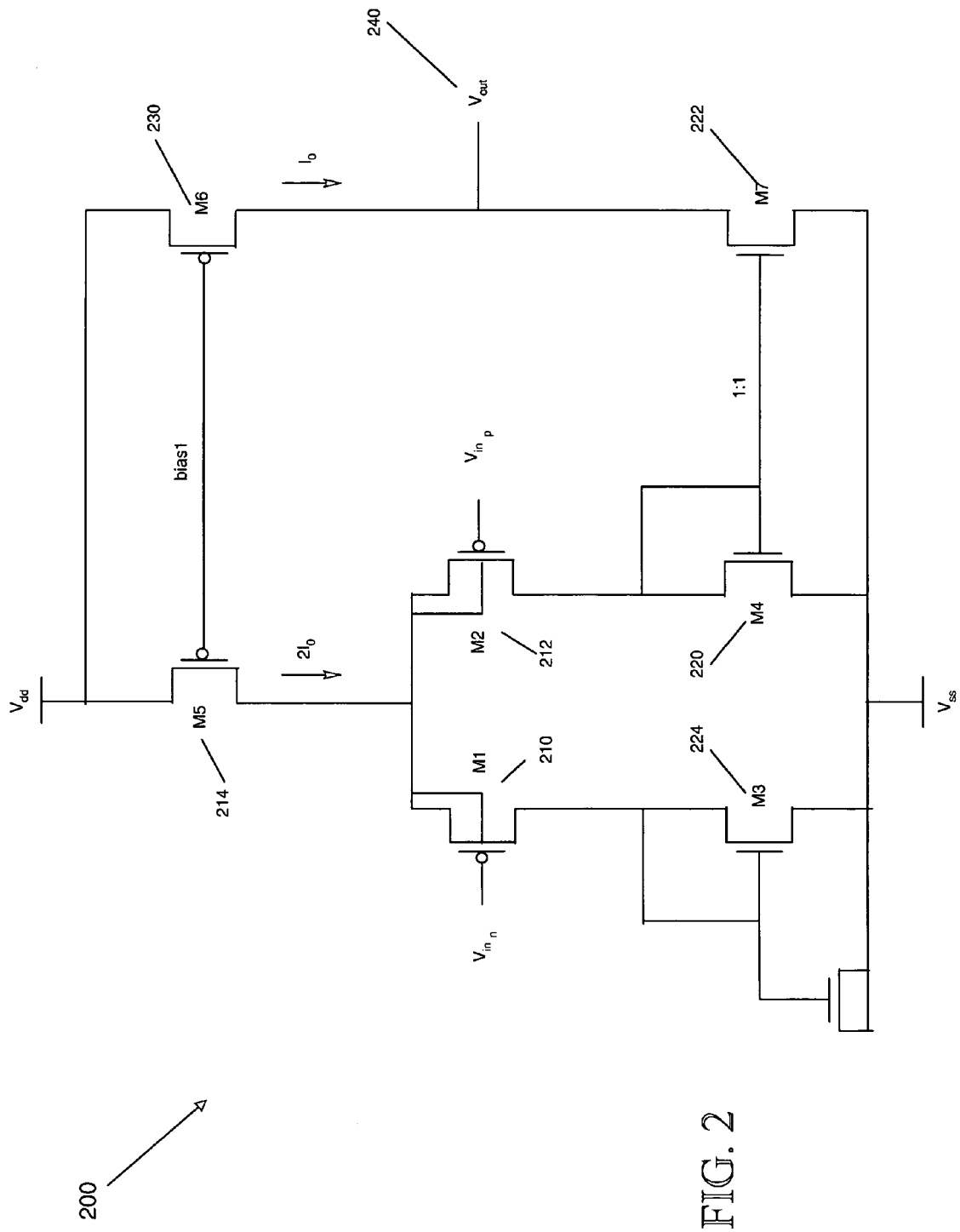
FIG. 2 illustrates a single-ended, single-stage current mirror transconductance amplifier (OTA)

FIG. 2 illustrates a single-ended, single-stage current mirror transconductance amplifier (OTA) 200. Static CMRR for the single ended current mirror OTA depicted in FIG. 2, is given by $$CMRR_{old} = g_m R_t$$

where $g_m$ is the transconductance of the differential pair transistor M1 210 or M2 212 and $R_t$ is the impedance of the tail current source ($r_{ds}$ for M5 214). Transistor non-idealities and mismatches produce an additional yet less significant contribution into the $CMRR_{old}$. The value of $g_m$ is usually fixed to obtain a stable operation of the single-stage OTA for a nominal (minimum) capacitive load. On the other hand, the impedance of the differential pair tail current source 214 can be increased using, for example, transistor cascoding, gain boosting or replica-tail feedback.

Transistor cascading reduces the input dynamic range and adds an extra pole and zero to the common mode gain transfer function. Gain boosting requires cascading of the tail current source 214 and reduces the common mode settling speed while improving the input dynamic range of the OTA 200. Replica-tail feedback is sensitive to transistor mismatch; it consumes extra power while improving the OTA input dynamic range.

Rail-to-rail OTA input stages employing both N- and P-differential pair transistors are not well suited for the high CMRR OTAs, both single-ended and differential, mainly because of the difference of the input offsets for the corresponding differential pairs. This differential pair input offset difference cannot be reduced by any other means except by increasing the size of the differential pair transistors. As a result either the power consumption increases or the frequency response of the OTA deteriorates.

Without loss of generality, assume that the standard OTA employs a 1:1 current mirror ratio (M4 220 equals M7 222). This ratio is common for high frequency OTAs with the first non-dominant pole being given approximately by the current mirror pole:

$$\omega_p = \frac{g_{m4}}{C_{gs4} + C_{gs7} + C_{gd7} + C_{gd2} + C_{d4} + C_{d2}},$$

where $C_{gsi}$, $C_{gdi}$ and $C_{di}$ are the gate-source (gate oxide and overlap), gate-drain (overlap) and drain (diffusion) capacitance respectively and the index "i" refers to the corresponding transistor. Note that the Miller effect for $C_{gd7}$ is not included because M7 222 is cascoded in practical high gain single-stage OTAs.

The current through M6 230 is denoted by $I_0$. $I_0$ is also the maximum output current of the OTA that determines the slewing speed $I_0/C_L$, where $C_L$ is an OTA load capacitance including output parasitics. Since the OTA current mirror ratio is 1:1, the current through M5 214 is given by $2I_0$. Thus the quiescent current of the OTA 200 in FIG. 2 is $3I_0$ and the maximum output current is 33% of the quiescent current.

The unwanted common mode gain of the single ended OTA 200 in FIG. 2 arises due to the finite impedance of the tail current source M5 214. The input common mode level of the OTA modulates the voltage across the tail current source 214 resulting in current variation through the differential pair transistors M1 210 and M2 212. This current variation is mirrored via M4 220 and M7 222 into the output 240 of the OTA 200, which is a high impedance. If the output impedance of the OTA 200 is $R_{out}$, then the differential and common mode gains $K_{diff}$ and $K_{cm}$ are given by $$K_{diff} = \frac{g_m R_{out}}{2}$$

$$K_{cm} = \frac{R_{out}}{2R_t}$$

$CMRR_{old}$ is equal to $K_{diff}/K_{cm}$ or as given earlier, $g_m R_t$. However, it is desirable for the current through M4 220 to be insensitive to the current variations of the tail current source M5 214.

Figure 3:
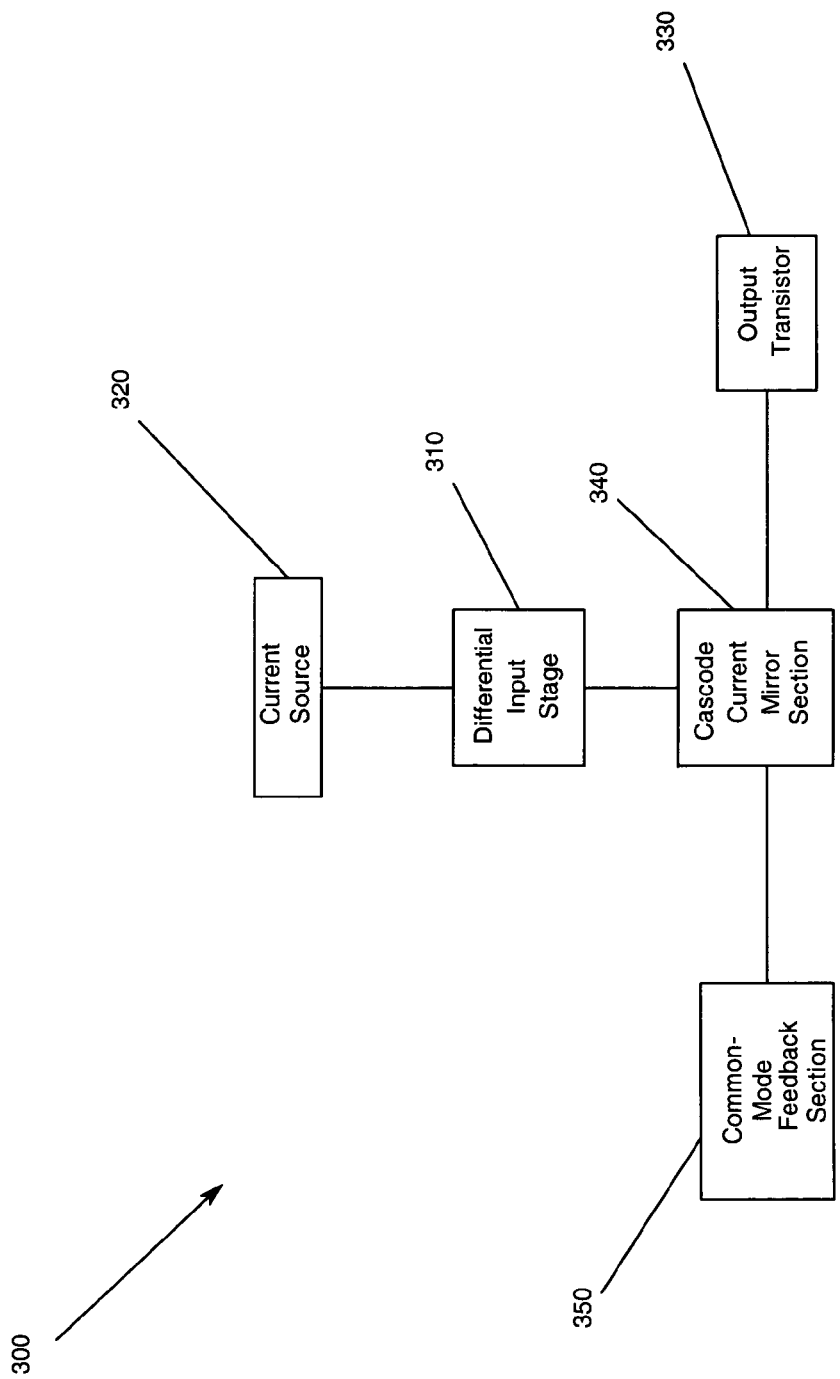
FIG. 3 illustrates a block diagram of a single-ended current mirror OTA with current common-mode feedback according to an embodiment of the present invention.

FIG. 3 illustrates a block diagram 300 of a single-ended current mirror OTA with current common-mode feedback according to an embodiment of the present invention. In FIG. 3, a differential input pair 310 provides an input stage (in one embodiment, the input stage may include transistors M1 410 and M2 412 of FIG. 4). A current source 320 (in one embodiment, the current source may include transistor M5 414 of FIG. 4) is coupled to the differential input pair 310 and provides current to the differential input pair 310. An output transistor 330 (in one embodiment, the output transistor may include transistor M7 422 of FIG. 4) provides an output current. However, a cascode current mirror section 340 (in one embodiment, the cascode current mirror section may include transistors M3 424 and M4 420 of FIG. 4) is coupled to the differential input pair 310 and to the output transistor 330. The output transistor 330 mirrors current in the cascode current mirror section 340, and therefore provides a mirrored current as the output current. A common-mode feedback (CMFB) section 350 (in one embodiment, the common-mode feedback section may include transistors M8 460, M9 462, and M10 450 of FIG. 4) compensates for a current change in the current source 320 to maintain a constant mirrored current.

Figure 4:
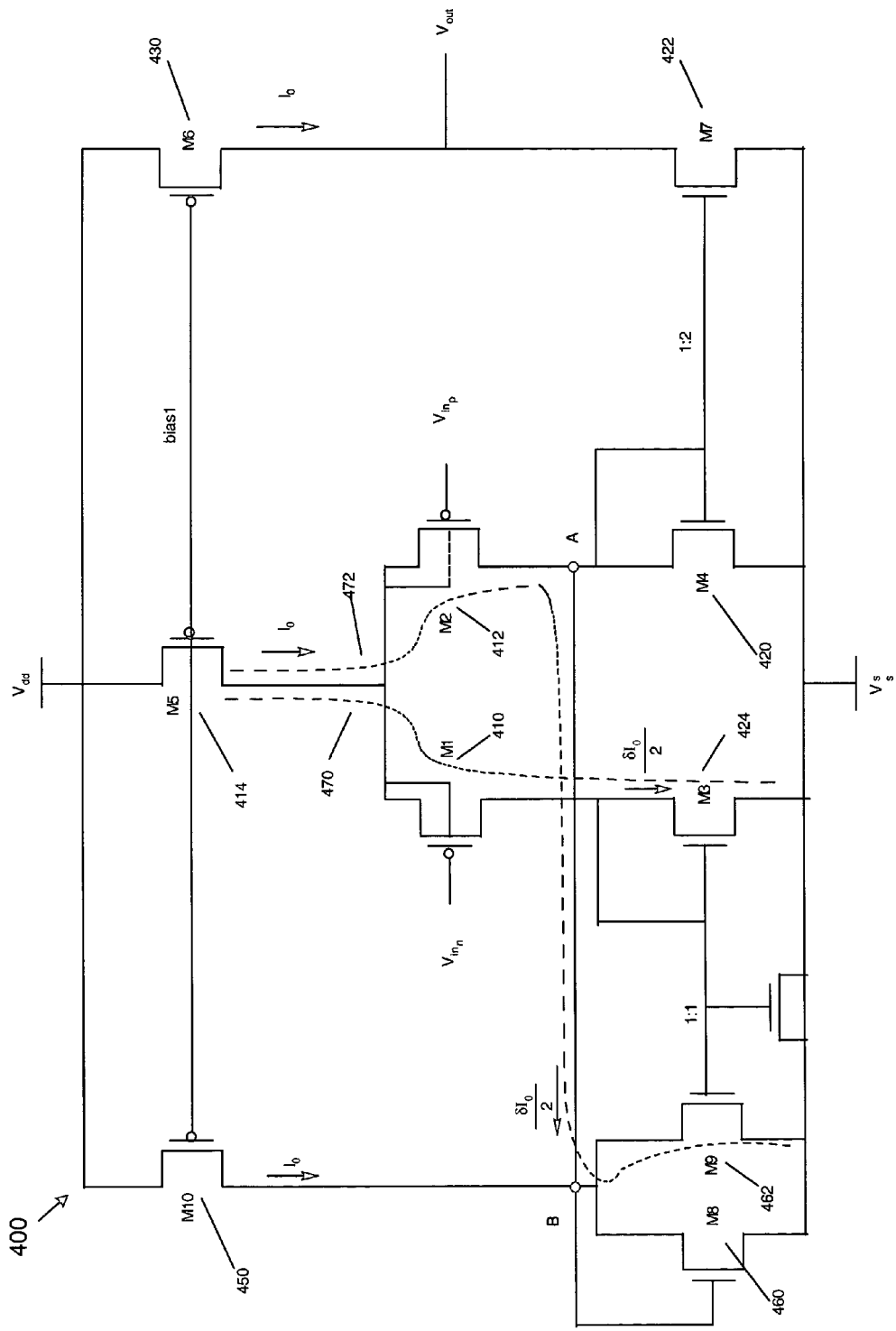
FIG. 4 illustrates a single-ended current mirror OTA with current common-mode feedback according to an embodiment of the present invention.

FIG. 4 illustrates a single-ended current mirror OTA with current common-mode feedback 400 according to an embodiment of the present invention. The OTA 400 of FIG. 4 does not compromise power, slewing, die area and dynamic range of the OTA 400, but allows a reduction in the settling speed by 5%–20% depending on the design. The proposed technique does not affect $g_m$ or $R_t$ for the CMRR calculation, and hence can be used in conjunction with cascoding or impedance boosting of the tail current source resulting in even higher CMRR.

A basic current mirror OTA employing a current CMFB as illustrated in FIG. 4 allows a significant improvement in CMRR. The tail current source M5 414 is now $I_0$ as opposed to $2I_0$ for the OTA in FIG. 2. Therefore the widths for M4 420 and M7 422 are scaled with a desired ratio (in one embodiment the desired ratio is 1:2). M1 410 and M2 412 are designed to have the same $g_m$ as in FIG. 2. An additional current branch with a fixed current $I_0$ is biased via M10 450. Transistors M8 460 and M9 462 employ the current CMFB. For the purpose of correct operation of the CMFB, transistors M3 424, M4 420, M8 460 and M9 462 are matched.

The operation of the circuit is as follows. If we assume initially that the currents through M10 450, M5 414 and M6 430 are as depicted in FIG. 4, then the currents through M8 460, M9 462, M3 424, M4 420 are each equal to $I_0/2$. Due to the symmetry of the circuit no current flows from node A to node B. Now consider a small current change via M5 414 (e.g., due to a common mode level change of the inputs of the OTA) to give $I_0 + \delta I_0$. This current splits equally in between differential pair transistors M1 410 and M2 412 to give $I_0 + \delta I_0/2$ for each transistor. The current through M1 410 is further carried by a 1:1 current mirror (M3, M9) to give $I_0/2 + \delta I_0/2$ via M9 462. Recall that transistors M2 412 and M9 462 experience an equal current change of $\delta I_0/2$.

Transistors M4 420 and M8 460 are in a MOS diode configuration connected to nodes A and B respectively, and the currents through M4 420 and M8 460 do not change. To prove that the currents through M4 420 and M8 460 do not change, it is sufficient to state that injecting a current into node A and sinking the same current out of node B (which is physically the same metal connection) does not violate the DC operating point (voltage) of both nodes A and B. To help understand the circuit operation, the path of the common mode level dependant current 510 is depicted in FIG. 4 using dashed lines 470, 472.

To prove that the CMFB according to one embodiment of the present invention does not affect differential signals, a demonstration that there is no signal dependant current flowing between nodes A and B is needed. Because the OTA differential input signal does not modulate the tail current voltage source, the sum of the two currents generated by M10 450 and M5 414 is also signal independent and given by $2I_0$. By design, the sum of currents through M3 424 and M4 420 is equal to the sum of currents through M8 460 and M9 462. Because M3 424, M4 420, M8 460 and M9 462 provide the only path for the current generated by M5 414 and M10 450, a signal independent current $2I_0$ is split equally between pairs of transistors M8 460, M9 462 and M3 424, M4 420. Transistor M10 450 injects a fixed current into node B, while transistors M8 460 and M9 462 sink a signal independent current out of node B. This implies that there is no signal dependant current flowing between nodes A and B.

The above analysis omits first order small effects such as the finite output impedance of the current mirror M3 424, M9 462. However, this simplification does not affect the analysis of the differential signal OTA response. Nevertheless, the first order small effects are significant in analysis of the common mode signal OTA response and, in fact, determine the CMRR. An analytical expression for the $CMRR_{new}$ of the OTA in FIG. 4 is bulky yet can be well approximated by $$CMRR_{new} = g_m R_t 2 g_{m4} \frac{r_{ds4} r_{ds2}}{r_{ds4} + r_{ds2}}$$

If the calculation for $CMRR_{old}$ given earlier, i.e., $CMRR_{old} = g_m R_t$, is compared to this $CMRR_{new}$, the $CMRR_{new}$ is improved by a factor of $$K_{impr} = 2 g_{m4} \frac{r_{ds2} r_{ds2}}{r_{ds4} + r_{ds2}}$$

In a standard CMOS 0.25 μm process, this factor is of the order of 30 for the minimum length transistors. Since $R_t$ is doubled and $g_m$ is not modified for the OTA 400 in FIG. 4, another improvement in CMRR by a factor of 2 may be obtained, which is not reflected in the improvement in CMRR given above.

The OTAs 200, 400 in FIGS. 2 and 4 consume the same power and provide a maximum 33% of the quiescent current to the load. The OTAs 200, 400 in FIGS. 2 and 4 have identical input/output dynamic range and occupy approximately the same area. Indeed, M3 424, M4 420, M8 460, M9 462 and M5 414, M10 450 of the OTA 400 in FIG. 4 are half the size of M3 224, M4 220 and M5 214 of the OTA 200 in FIG. 2 respectively. However, it is not so obvious that the first non-dominant poles are close to each other for both OTAs. Indeed, despite the transistors M4 420 and M7 422 are scaled as 1:2 in FIG. 4, they are a part of the current mirror M4 420, M7 422, M8 460 with a 1:1 current ratio. The pole of the current mirror M4 420, M7 422, M8 460 is about 5%–20% less than the current mirror pole provided above because of the additional parasitic diffusion and overlap capacitance of M9 462 and M10 450. The relative contribution of M9 462 and M10 450 into the current mirror pole is reduced when the gain of the current mirror is increased.

Figure 5:
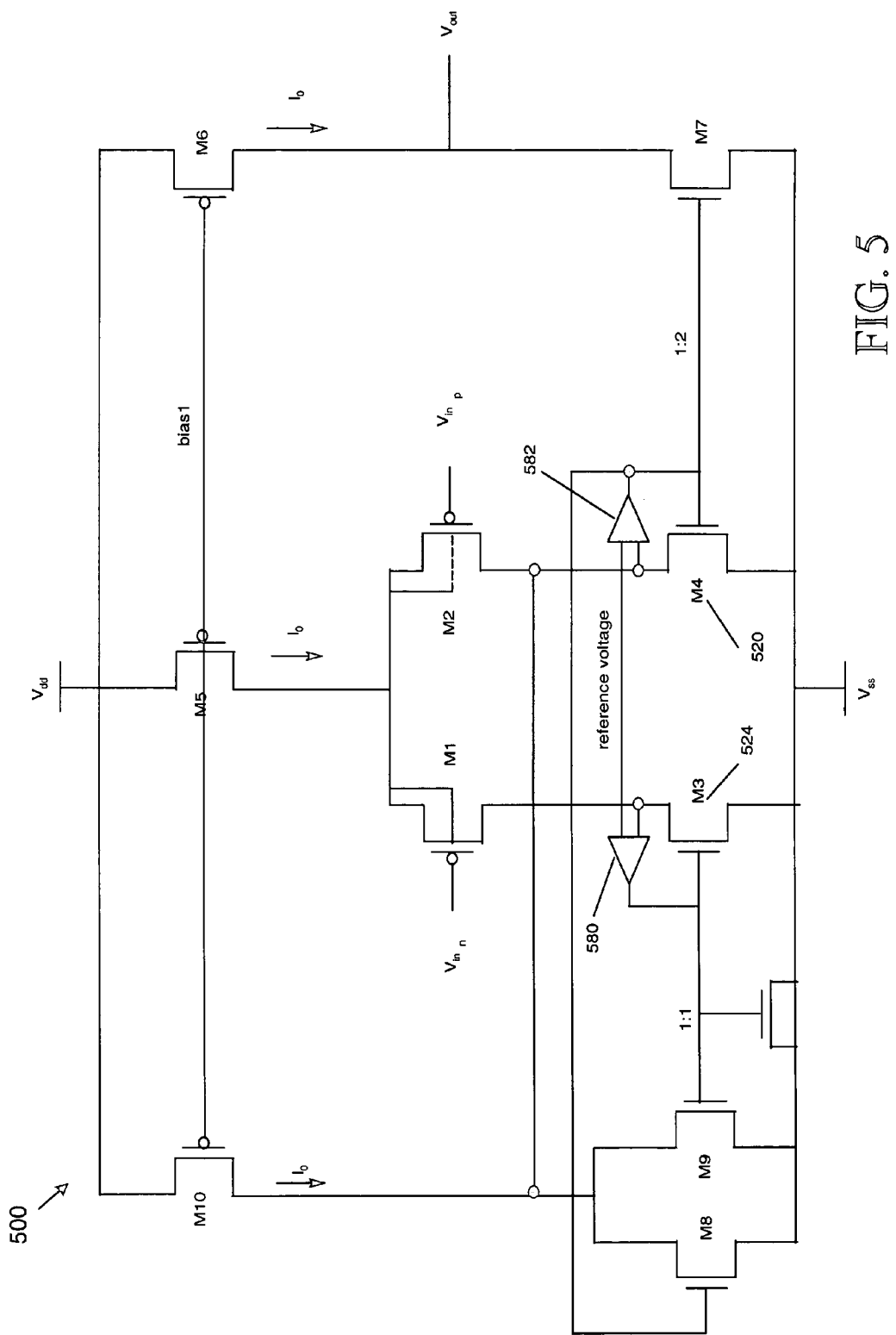
FIG. 5 illustrates a single-ended current mirror OA with enhanced current common-mode feedback according to an embodiment of the present invention.

If the CMRR improvement factor, $K_{impr}$, is not sufficient, an enhanced version of the circuit of FIG. 4 may be provided. FIG. 5 illustrates a single-ended current mirror OA with enhanced current common-mode feedback 500 according to an embodiment of the present invention. In FIG. 5, two amplifiers 580, 582 are used to boost the transconductance of M3 524 and M4 520. If the gain of these amplifiers 580, 582 is $K_{amp}$ then the $K_{impr}$ becomes $$K_{impr} = 2 K_{amp} g_{m4} \frac{r_{ds2} r_{ds2}}{r_{ds4} + r_{ds2}}$$

Thus, CMFB according to embodiments of the present invention may be used for boosting the CMRR of an OTA until other factors, e.g., a transistor mismatch, limit the performance of the OTA.

While embodiments of the present invention implemented as a current mirror OTA have been shown, those skilled in the art will recognize that the present invention is not meant to be limited to a current mirror OTA. The current mirror OTA provides a larger input/output dynamic range as compared to the telescopic OTA and, by means of the current mirror ratio, allows an efficient tradeoff of power vs. speed, which is not the case for the folded cascode OTA. A class A OTA with no push-pull action is preferred because it consumes a constant current and hence causes a minimum power supply noise.

Figure 6:
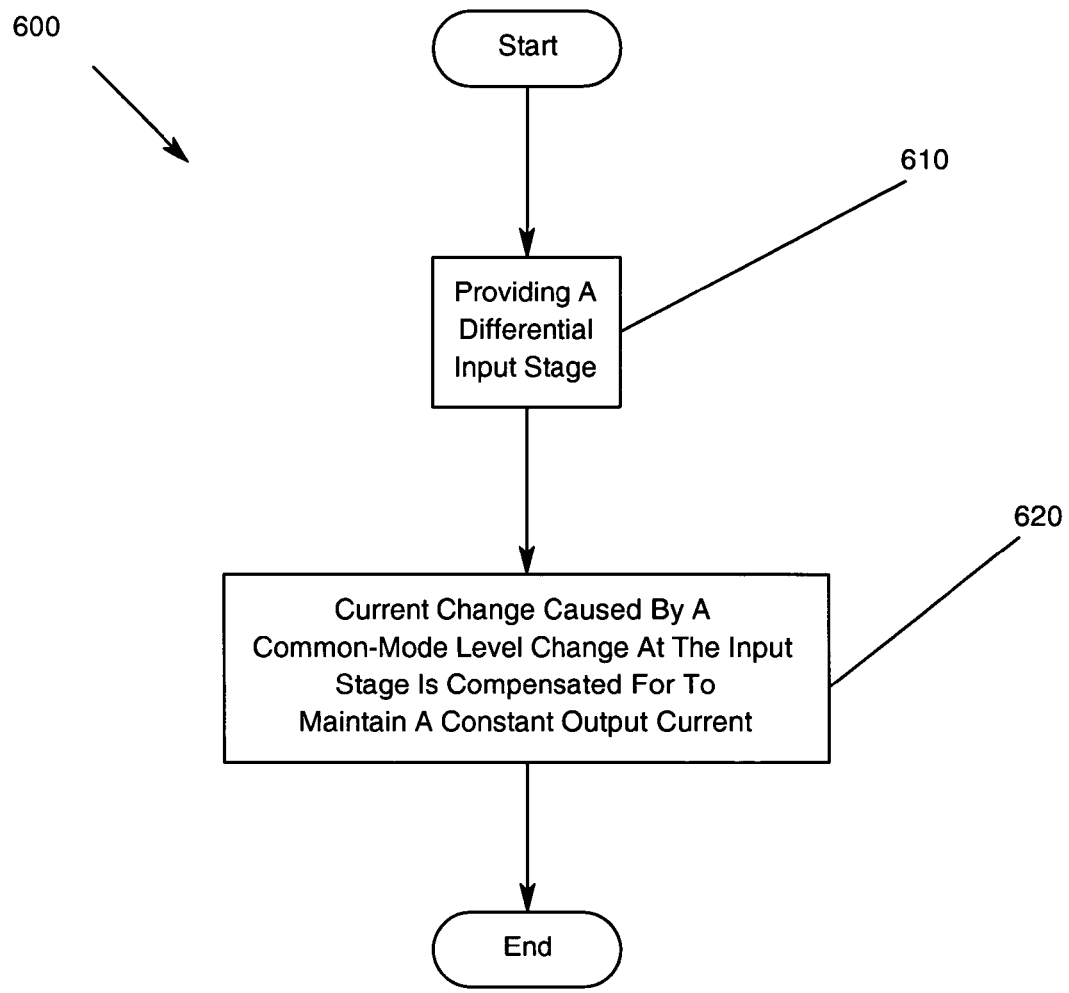
FIG. 6 is a flow chart for the method for providing high common-mode rejection ratio in a single-ended CMOS operational transconductance amplifier according to an embodiment of the present invention.

FIG. 6 is a flow chart 600 for the method for providing high common-mode rejection ratio in a single-ended CMOS operational transconductance amplifier according to an embodiment of the present invention. In FIG. 6, a differential input stage is provided 610. Current change caused by a common-mode level change at the input stage is compensated for to maintain a constant current at the output 620.

The foregoing description of the exemplary embodiment of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

What is claimed is:

1. A CMOS operational transconductance amplifier, comprising:
a differential input transistor pair providing an input stage for receiving a pair of input voltages;
a current source, coupled to the differential input transistor pair, for providing current to the differential input transistor pair;
an output transistor for conducting an output current proportional to a difference between the pair of input voltages applied to the differential input transistor pair;
a cascode current mirror section, coupled to the differential input transistor pair and the output transistor, the cascode current mirror section providing a mirrored current as the output current for the output transistor, the cascode current mirror section comprising a first current mirror transistor coupled to a drain of a first transistor of the differential input transistor pair and a second current mirror transistor coupled to a drain of a second transistor of the differential input transistor pair, the second current mirror transistor being coupled to the output transistor; and
a common-mode feedback section, coupled to the differential input transistor pair, wherein the common-mode feedback section absorbs a current change in the current source to maintain a constant current in the output transistor, the common-mode feedback section comprising a second current source and a common-mode feedback differential pair, a transistor of the common-mode feedback differential pair mirroring current through the first current mirror transistor.

2. The CMOS operational transconductance amplifier of claim 1 wherein the second current mirror transistor and the output transistor are scaled to provide a desired current ratio.

3. The CMOS operational transconductance amplifier of claim 1 wherein a transistor of the common-mode feedback differential pair and the first current mirror transistor absorb the current change in the current source to maintain a constant current in the second current mirror transistor.

4. The CMOS operational transconductance amplifier of claim 1 wherein the cascode current mirror section further comprises an amplifier section for boosting transconductance of the cascode current mirror section.

5. The CMOS operational transconductance amplifier of claim 4 wherein the amplifier section comprises a first amplifier coupled to the first current mirror transistor and a second amplifier coupled to the second current mirror transistor.

6. A method for providing high common-mode rejection ratio in a single-ended CMOS operational transconductance amplifier, comprising:
providing an differential input stage;
providing a current source to the differential input stage;
providing a cascode current mirror section coupled to the differential input stage, wherein providing the cascode current mirror section further comprises providing a first current mirror transistor coupled to a drain of a first transistor of the differential input stage and providing a second current mirror transistor coupled to a drain of a second transistor of the differential input stage, the second current mirror transistor being coupled to an output transistor;

coupling an output transistor to the cascode mirror section to mirror current at the cascode current mirror section;

compensating for a current change caused by a common-mode level change at the differential input stage to maintain a constant current at an output; and wherein compensating for a current change further comprises providing a second current source and a common-mode feedback differential pair, a transistor of the common-mode feedback differential pair mirroring current through the first current mirror transistor.

7. The method of claim 6 wherein the providing the second current mirror transistor and the output transistor further comprises forming the output transistor with a width twice the width of the second current mirror transistor to provide a desired current ratio.

8. The method of claim 6 wherein the compensating for a current change further comprises absorbing the current change in the current source using the transistor of the common-mode feedback differential pair and the first current mirror transistor.

9. The method of claim 6 further comprising boosting transconductance of the cascode current mirror section using an amplifier section.

10. The method of claim 9 wherein the boosting the transconductance of the cascode current mirror section using an amplifier section further comprises providing a first amplifier coupled to the first current mirror transistor and providing a second amplifier coupled to the second current mirror transistor.

11. An analog-to-digital converter (ADC), comprising:
a sample-and-hold circuit for sampling an input analog signal and providing a held sample at an output of the sample-and-hold circuit;
a gain stage, coupled to the output of the sample-and-hold circuit, for amplifying the held sample and providing an amplified signal at an output of the gain stage;
a comparator circuit, coupled to the output of the gain stage, the comparator circuit comparing the amplified signal to a reference signal to provide a digital output based upon the comparison;
wherein at least one of the sample-and-hold circuits, gain stage and comparator circuit includes a CMOS operational transconductance amplifier, the CMOS operational transconductance amplifier comprises:
a differential input transistor pair providing an input stage for receiving a pair of input voltages;
a current source, coupled to the differential input transistor pair, for providing current to the differential input transistor pair;
an output transistor for conducting an output current proportional to a difference between the pair of input voltages applied to the differential input transistor pair; and
a common-mode feedback section, coupled to the differential input transistor pair, wherein the common-mode feedback section absorbs a current change in the current source to maintain a constant current in the output transistor.

12. The ADC of claim 11 further comprising a cascode current mirror section, coupled to the differential input transistor pair and the output transistor, the cascode current mirror section providing a mirrored current as the output current for the output transistor.

13. The ADC of claim 12 wherein the cascode current mirror section comprises a first current mirror transistor coupled to a drain of a first transistor of the differential input transistor pair and a second current mirror transistor coupled to a drain of a second transistor of the differential input transistor pair, the second current mirror transistor being coupled to the output transistor.

14. The ADC of claim 13 wherein the second current mirror transistor and the output transistor are scaled to provide a current ratio of 1:2.

15. The ADC of claim 13 wherein the common-mode feedback section comprises a second current source and a common-mode feedback differential pair, a transistor of the common-mode feedback differential pair mirroring current through the first current mirror transistor.

16. The ADC of claim 15 wherein the transistor of the common-mode feedback differential pair and the first current mirror transistor absorb the current change in the current source to maintain a constant current in the second current mirror transistor.

17. The ADC of claim 13 wherein the cascode current mirror section further comprises an amplifier section for boosting transconductance of the cascode current mirror section.

18. The ADC of claim 17 wherein the amplifier section comprises a first amplifier coupled to the first current mirror transistor and a second amplifier coupled to the second current mirror transistor.

19. The ADC of claim 12 wherein the cascode current mirror section further comprises an amplifier section for boosting transconductance of the cascode current mirror section.

20. A CMOS operational transconductance amplifier, comprising:
a differential input pair providing an input stage;
a current source, coupled to the differential input pair, for providing current to the differential input pair;
an output transistor providing an output current;
a first current mirror transistor coupled to a drain of a first transistor of the differential input pair;
a second current mirror transistor coupled to a drain of a second transistor of the differential input pair, the second current mirror transistor being coupled to the output transistor for providing a mirrored current as the output current for the output transistor;
a second current source; and
a common-mode feedback differential pair, coupled to the second current source and to the first and second current mirror transistors, a transistor of the common-mode feedback differential pair mirroring current through the first current mirror transistor to compensate for a current change in the current source to maintain a constant mirrored current.

21. The CMOS operational transconductance amplifier of claim 20 wherein the second current mirror transistor and the output transistor are scaled to provide a desired current ratio.

22. The CMOS operational transconductance amplifier of claim 20 wherein the transistor of the common-mode feedback differential pair and the first current mirror transistor absorb the current change in the current source to maintain a constant current in the second current mirror transistor.

* * * * *